(12) United States Patent
Oshika et al.

(10) Patent No.: US 8,404,359 B2
(45) Date of Patent: Mar. 26, 2013

(54) SOLDER LAYER AND ELECTRONIC DEVICE BONDING SUBSTRATE AND SUBMOUNT USING THE SAME

(75) Inventors: Yoshikazu Oshika, Chiyoda-ku (JP); Masayuki Nakano, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 1463 days.

(21) Appl. No.: 11/694,920

(22) Filed: Mar. 30, 2007

(65) Prior Publication Data

US 2007/0228105 A1    Oct. 4, 2007

(30) Foreign Application Priority Data

Mar. 31, 2006  (JP) ................................. 2006-101227
Mar. 15, 2007  (JP) ................................. 2007-067629

(51) Int. Cl.
*B32B 5/18* (2006.01)
*B32B 15/01* (2006.01)
*B23K 1/00* (2006.01)

(52) U.S. Cl. .... 428/672; 428/620; 228/205; 228/262.61

(58) Field of Classification Search .......................... None
See application file for complete search history.

(56) References Cited

U.S. PATENT DOCUMENTS

| | | | | |
|---|---|---|---|---|
| 2003/0153172 A1* | 8/2003 | Yajima et al. | ................. | 438/612 |
| 2003/0197277 A1* | 10/2003 | Yamamoto et al. | ........... | 257/772 |
| 2004/0072416 A1* | 4/2004 | Fay | ............................... | 438/614 |
| 2005/0194690 A1 | 9/2005 | Ishii et al. | | |
| 2005/0233568 A1 | 10/2005 | Noritake et al. | | |
| 2007/0183922 A1 | 8/2007 | Ishikawa et al. | | |

FOREIGN PATENT DOCUMENTS

| | | |
|---|---|---|
| JP | H11-074298 A | 3/1999 |
| JP | 2002-184698 A | 6/2002 |
| JP | 2003-258360 A | 9/2003 |
| JP | 2004-072048 A | 3/2004 |
| JP | 2005-310956 A | 11/2005 |
| JP | 2006-007288 A | 1/2006 |
| JP | 2006-286944 A | 10/2006 |

OTHER PUBLICATIONS

Masayuki et al (JP 2006-286944 English Machine Translation) Oct. 2006.*
Yoshikazu et al (JP 2006-261569 English Machine Translation) Sep. 2006.*
L. Buene, et al., "Alloying Behavior of Au-In and Au-Sn Films on Semiconductors," Thin Solid Films, vol. 34 (1), pp. 149-152 (1976).

(Continued)

*Primary Examiner* — Jennifer McNeil
*Assistant Examiner* — Jason Savage
(74) *Attorney, Agent, or Firm* — Chen Yoshimura LLP

(57) ABSTRACT

A solder layer and an electronic device bonding substrate using the layer are provided which avoid deteriorating qualities of the electronic device to be bonded. In a solder layer 14 free from lead and formed on a substrate 11 or an electronic device bonding substrate 10 having such a solder layer, the solder layer 14 has a specific resistance of not more than 0.4 $\Omega \cdot \mu m$. The electronic device bonding substrate 10 can have a thermal resistance of not more than 0.5 K/W and a thickness of not more than 10 μm. Then, voids contained in the solder layer 14 have a maximum diameter of not more than 0.5 μm and the substrate can be a submount substrate.

3 Claims, 7 Drawing Sheets

OTHER PUBLICATIONS

S. Knight, et al., "Ohmic Contacts for Gallium Arsenide Bulk Effect Devices," Symposium on Ohmic Contacts, pp. 102-114 (1969).

M. Hutter, et al., "Calculation of Shape and Experimental Creation of AuSn Solder Bumps for Flip Chip Applications," IEEE Electronic Components and Technology Conference, pp. 282-288 (2002).

Japanese Office Action dated Nov. 20, 2012, in a counterpart Japanese patent application No. 2007-067629. (Concise Explanation of Relevance: The Japanese Office Action rejects claims in the Japanese application in view of Foreign Patent document Nos. 1-5.).

* cited by examiner (a)

(b)

SOLDER LAYER AND ELECTRONIC DEVICE BONDING SUBSTRATE AND SUBMOUNT USING THE SAME

TECHNICAL FIELD

The present invention relates to a solder layer and an electronic device bonding substrate and submount using the same, for bonding, among others, an electronic device such as a semiconductor device.

BACKGROUND ART

Heretofore, when an electronic device such as a semiconductor device is installed in a circuit formed on a substrate, it has been the practice to bond the electronic device to the substrate using a solder layer of which lead (Pb) is a principal component to form an electrical or electronic circuit. Such a Pb containing solder layer that is low in resistance has been used to bond an electronic device to the circuit.

However, solders consisting of Pb or tin (Sn) are tending to be prohibited from use in recent years. Especially in Europe, their use has been banned since Jul. 1, 2006 by the RoHS Directive (directive of the European Assembly and Directorate on restriction of the use of certain hazardous substances in electrical and electronic equipment). Consequently, as alternatives of the Pb containing solder, solders that contain Pb unavoidably, that is, lead free solders, such as those formed of Au—Sn, Ag—Sn, In—Sn, Zn—Sn and Bi—Sn have been proposed.

Nonpatent References 1 and 2 listed infra report on electrical adhesiveness to semiconductors of An—Sn or the like as a Pb free ohmic electrode material. Nonpatent Reference 3 listed infra reports shapes of a bump electrode formed of Au—Sn semiconductor layer.

Also, with development of integration of electronic circuits in recent years, electronic devices driven by high electric power are wanted. An electronic device such as of semiconductor driven by high electric power is large in heat value while it is driven so that its electrical properties may come to be changed by the heat generated. Further, since a solder for bonding a semiconductor device, a radiator plate, and a semiconductor device and a radiator plate normally varies in coefficient of thermal expansion with objects to be bonded, if heat developed of the semiconductor device is large an inconvenience is caused such as that the semiconductor device or solder may come off from the radiator plate. For this reason, a variety of measures have been devised to emit the heat developed. For examples a semiconductor device to be packaged on a substrate is mounted on a substrate that is high in heat conductivity enough to be a radiator plate or heat sink, to efficiently dissipate the heat developed from the semiconductor device. Also, in order to improve heat dissipation characteristics and to dissipate the heat developed from an electronic device driven by higher electric power, a substrate higher in heat conductivity, that is, a submount having a submount substrate may be interposed between the semiconductor device and a radiator plate in the package. Such a substrate higher in heat conductivity can be of aluminum nitride (AlN).

Patent Reference 1 listed infra discloses a submount in which an adherent layer of Ti (titanium) and Pt (platinum), an electrode layer of Au (gold), a solder barrier layer of Pt (platinum) and a solder layer of Au—Sn are laid on top of another on a portion of a sintered aluminum nitride substrate.

Patent Reference 2 infra by the present inventors discloses a submount that comprises a sintered aluminum nitride substrate, an electrode layer formed on a surface of the sintered aluminum nitride substrate and a solder layer formed on the electrode layer. In this submount, it is taught that by reducing the carbon concentration at an interface between the sintered aluminum nitride substrate and/or the electrode layer and at an interface between the electrode layer and the solder layer to $1\times10^{20}$ atoms/cm$^3$ or less, it is possible to improve the adherence between the sintered aluminum nitride substrate and the electrode layer formed on its surface and/or the electrode layer and the solder layer.

[Patent Reference 1] Japanese Patent Laid Open Application, JP 2003-258360 A
[Patent Reference 2] Japanese Patent Laid Open Application, JP 2006-286944 A
[Nonpatent Reference 1] L. BUENE and 4 others, "ALLOYING BEHAVIOR of Au—In AND Au—Sn FILMS ON SEMICONDUCTORS", Thin Solid Films, Vol. 34(1), pp. 149-152, 1976
[Nonpatent Reference 2] S. Knight and 1 other, "OHMIC CONTACTS FOR GALLIUM ARSENIDE BULK EFFECT DEVICES", Symposium on Ohmic Contacts, pp. 102-114, 1969
[Nonpatent Reference 3] M. Hutter and 6 others, "Calculation of Shape and Experimental Creation of AuSn Solder Bumps for Flip Chip Applications", IEEE Electronic Components and Technology Conference, pp. 282-288, 2002

DISCLOSURE OF THE INVENTION

Problems to be Solved by the Invention

With a solder layer formed of Pb free solder, however, if the solder layer is molten by lamp heating or the like and then solidified, voids growing in the solder layer make its electrical resistance increased. Thus, when an electronic device is bonded to a substrate via the Pb free solder layer, an increased resistance of the solder layer formed on the substrate causes a corresponding voltage drop in the electronic device, necessitating higher voltage to be applied thereto. Especially where a semiconductor device such as a light emitting diode is mounted to form an optical device circuit, a parasitic resistance caused due to voids in the solder layer tends to produce noises and joule heat in the device, deteriorating its property.

In the technique described in Patent Reference 1, suppressing the increase of the particle size by adjusting deposition conditions for a solder layer may reduce the surface roughness of the grown solder layer. However, due to photolithography used to prepare an electrode layer, a resist component volatilized by heating during deposition of the Au electrode layer or elements such as carbon contained in a stripping liquid used in its lift-off tend to deposit on the electrode layer surface. Thus, the elements such as carbon deposited on the electrode layer surface while the solder layer is grown on the electrode layer tend to be mixed in the solder layer, forming voids in the solder layer molten and solidified. And, the resistance comes to accrue at a junction where a light emitting device is bonded to the electrode layer via the solder layer prepared thereon. Also, in a metal masking process used to form the solder layer, it is difficult to control positioning the solder layer. The method is poor in controllability so that solder layers come to be deviated in forming position with their efficiency percentage lowered.

In the technique described in Patent Reference 2, interfaces are cleaned by ultraviolet ozone processing or plasma ashing. The adhesion at an interface between an electrode layer and a solder layer is improved by, e.g., decreasing carbon concentration thereat. Due to photolithography used to grow the solder layer, however, a masking material in part is mixed in the solder layer during its growth process so that the thermal resistance of a submount and the specific resistance of the solder layer remain high.

In view of the problems mentioned above, it is an object of the present invention to provide a solder layer that is free from lead and is low in electric resistance, and electronic device bonding substrate and submount using such an solder layer.

Means for Solving the Problems

After having conducted zealous investigations the present inventors have acquired the knowledge that the electric resistance of a solder layer can be reduced if the density or the maximum diameter is reduced of voids of the solder layer free from lead or its bonded surface with a semiconductor device before and after its melting and solidification, and then arrived at the present invention.

In order to achieve the object mentioned above, there is provided in accordance with the present invention a solder layer free from lead and formed on a substrate, characterized in that the solder layer has a specific resistance of not more than 0.4 Ω·μm.

The present invention also provides a solder layer free from lead and formed on a substrate, characterized in that voids contained in the solder layer have a maximum diameter of not more than 0.5 μm.

The present invention also provides a solder layer free from lead and having an electronic device bonded, characterized in that voids contained in the solder layer have a maximum diameter of not more than 0.5 μm.

In the constructions mentioned above, the solder layer molten and solidified has preferably a thickness of not more than 10 μm.

According to the construction mentioned above, where an electronic device is bonded by soldering with a lead free solder layer molted and solidified it is possible to reduce a parasitic resistance due to voids in the solder layer and further to reduce the voltage applied thereto and thus to form an electrical circuit that can be driven by a minimum of power as required.

In order to achieve the object mentioned above, there is also provided in accordance with the present invention an electronic device mounting substrate comprising a substrate and a solder layer free from lead and formed on the substrate, characterized in that said solder layer has a specific resistance of not more than 0.4 Ω·μm.

The present invention further provides an electronic device mounting substrate comprising a substrate and a solder layer free from lead and formed on the substrate, characterized in that voids contained in said solder layer have a maximum diameter of not more than 0.5 μm.

In the constructions mentioned above, the electronic device mounting substrate preferably has a thermal resistance of not more than 0.5 K/W. The said solder layer after its melting and solidification preferably has a thickness of not more than 10 μm. The substrate is preferably a submount substrate.

According to the construction mentioned above, it is possible to reduce the resistance developed in the solder layer with which an electronic device is mounted, and to prevent it from exerting an adverse influence on an operation of the electronic device. In a preferred form of implementation of the invention, since the surface roughness of the solder layer molten and solidified is reduced and/or the maximum diameter of voids in the solder layer and at an interface between the solder layer and the semiconductor device is reduced, a good ohmic contact thereat becomes possible. Thus, e.g., where a semiconductor device such as a light emitting diode is mounted to form an optical device circuit, since a parasitic resistance can be reduced, it is possible to suppress generation of Joule heat in the semiconductor device and noises in an output thereof.

Figure 1:
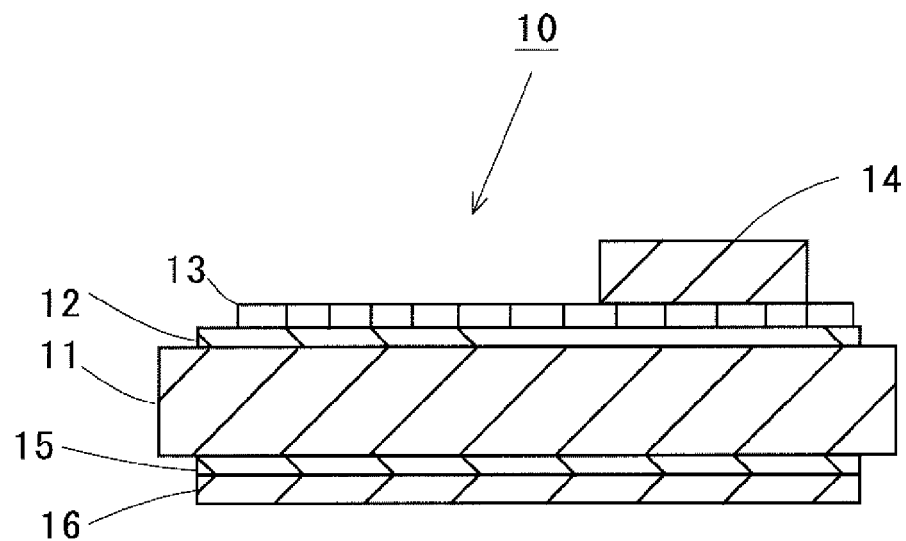
FIG. 1 is a cross-sectional view illustrating the structure of an electronic device bonding submount according to the present invention.

| Description of Reference Characters |
|---|
| 1: semiconductor device (light emitting diode) |
| 1a: substrate for light emitting diode |
| 1A: lower electrode |
| 1B: upper electrode |
| 2A, 2B: gold wire |
| 10: electronic device bonding substrate |
| 10A: electronic device bonding submount |
| 11: substrate |
| 11A: submount substrate |
| 12, 15: adherent layer |
| 13: electrode layer |
| 14, 16: solder layer |
| 20: electronic component |
| 31: DC source |
| 32: inlet terminal for current I |
| 33: voltage terminal |
| 40: stem |
| 42: low-temperature solder |

Effects Of The Invention

According to the present invention, a solder layer is provided which is low in electrical resistance although it is free from lead.

According to the present invention, an electronic device bonding substrate or an electronic device bonding submount using a lead free solder layer is provided in which the solder layer is low in electrical resistance and which is low in thermal resistance. Consequently, it is possible to reduce the loss of electric power due to generation of Joule heat and to reduce the applied voltage and thus to form an electronic circuit that can be driven by a minimum of power as required.

BEST MODES FOR CARRYING OUT THE INVENTION

Hereinafter, the present invention will be described in detail with reference to certain forms of implementation thereof.

A solder layer according to the present invention is formed on a given substrate and consists of a solder that does not contain lead, that is, a Pb-free solder. The term "solder layer which does not contain" or "is free from" "Pb" according to the present invention is intended to mean a layer of a solder of which lead is not an intentional component. Lead that is unavoidably contained as a residue on refining of components may be contained in a lead free solder layer in an amount such that it does not exert any influence on the environment or the like. As the lead free solder, use is preferably made of a solder containing two or more elements of, e.g., silver (Ag), gold (Au), copper (Cu), zinc (Zn), nickel (Ni), indium (In), gallium (Ga), bismuth (Bi), aluminum (Al) and tin (Sn).

When a light emitting diode chip as an electronic device is bonded to a solder layer, if the solder layer is thick, an emitting layer of the chip becomes embedded in the solder layer so that the light emitting diode does not emit light. Thus, a solder layer that has been molten and solidified should preferably have a thickness of not more than 10 μm.

A solder layer according to the present invention is characterized in that the solder layer molten and solidified is small in number of voids contained therein and small in void size and thus is low in specific resistance. Especially, the specific resistance of the solder layer molten and solidified becomes 0.4 Ω·μm or lower if the maximum diameter of voids contained in the solder layer molten and solidified is reduced to 0.5 μm or less. If the specific resistance of a solder layer molten and solidified is reduced to 0.4 Ω·μm or less, an ohmic loss due to electrical resistance of the solder layer should have a negligible influence on a voltage and current necessary to cause a semiconductor laser or a light emitting diode bonded to the solder layer to emit light. This allows the ratio of emission output to input power, namely the efficiency to be improved. Further, since generation of a Joule heat due to an extra resistance can be suppressed, a drop in emission output due to heating of the light emitting device can be suppressed. Furthermore, with the void density made 1 void/μm$^2$, the solder layer should advantageously have its specific resistance further reduced to 0.2 Ω·μm or less.

Here, the term "molten and solidified" is intended to mean that a solder layer formed on a substrate is molten by heating it to a temperature above its melting point and then is solidified by cooling it to a temperature below the melting point.

As mentioned above, a solder layer that is free from lead in accordance with the present invention can be reduced in specific resistance since voids therein have a maximum diameter reduced. This allows electric current to be passed through a semiconductor device such as a light emitting diode bonded to a lead free solder layer while suppressing generation of heat in the solder layer and hence can suppress a drop in performance of a variety of electronic devices.

Here, the term "electronic device" referred to herein is intended to mean including circuit components including active components such as a semiconductor device and an integrated circuit by semiconductor devices as well as passive components such as a capacitor, inductance and switch etc.

Mention is next made of an electronic device bonding substrate.

An electronic device bonding substrate according to the present invention has an electrical or electronic circuit wiring or a metal layer formed on a substrate such as a ceramic substrate or printed circuit board where the electrical or electronic circuit wiring or metal layer is composed mainly of copper or gold (Au) for operating an electronic device. On this wiring or metal layer, the electronic device bonding substrate has a lead free solder layer formed for bonding the electronic device to the electronic device bonding substrate. And, the lead fee solder layer has therein voids small in number and size and thus reduced in specific resistance. Especially, if the voids of a solder layer molten and solidified are made to have a maximum diameter of not more than 0.5 μm, the solder layer molten and solidified can have a specific resistance of not more than 0.4 Ω·μm. The solder layer that is small in specific resistance can suppress generation of Joule heat and power consumption. Further, the solder layer if its void density is made not more than 1 void/μm$^2$, can have a specific resistance of not more than 0.2 Ω·μm.

As voids produced in the solder layer after its melting and solidification are small in diameter, its molten and solidified surfaces are held to remain flat. Therefore, the light reflectivity of the solder layer surfaces can be increased. As a result, a light emitting device mounted on the electronic device bonding substrate can have its emission output increased since light emerging from it on its solder layer side is reflected at an increased probability.

As voids therein are small in diameter and low in density, the solder layer is low in thermal resistance. Further, by reducing the density of carbon at an interface between an electrode layer and the solder layer and at an interface between the substrate and the electrode layer of an electronic device bonding substrate to not more than 1×10$^{20}$ cm$^{-3}$, it is possible to reduce the thermal resistance at the interfaces between the electrode layer and the solder layer and between the substrate and the electrode layer. According to an electronic device bonding substrate as mentioned above, it is possible to reduce its thermal resistance to not more than 0.5 K/W and to efficiently transfer and release the heat generated to the substrate when an electronic device is driven. By reducing the thermal resistance to 0.5 K/W or lower, the device characteristics and its reliability can be improved. It can be satisfactorily used, not only for compact modules such as conventional mobile phones and consumer goods, but also for the fields of thermally heavy load such as automobiles and power devices.

The solder layer molten and solidified should preferably have a thickness of not more than 10 μm. If this range is exceeded, e. g., if a light emitting diode chip as an electronic device is bonded, disadvantageously a light emission layer of the chip when bonded becomes embedded in the solder layer so as to disable the light emitting diode from emitting light.

While mention is made above of the solder layer and the electronic device bonding substrate incorporating the same according to the present invention, the present invention will be described in further details with respect to certain forms of embodiments thereof with referencing to the drawings.

FIG. 1 is a cross-sectional view illustrating the structure of an electronic device bonding substrate 10 according to the present invention. The electronic device bonding substrate 10 of the present invention as shown in FIG. 1 comprises a substrate 11, an adherent layer 12 formed on an upper surface of the substrate 11, namely on a surface thereof on the side on which a semiconductor device is mounted, an electrode layer 13 formed on the adherent layer 12, and a solder layer 14 formed on the electrode layer 13. Partly or wholly on a surface of the substrate 11 opposite to its upper surface on the side on which the semiconductor device is mounted, namely on its rear surface, an adherent layer 15 is formed on which a solder layer 16 may if needed be formed. The adherent layer 15 and the solder layer 16 on the rear surface of the substrate 11 may be formed of the same or different materials as or from those of the adherent layer 12 and the solder layer 14 on its upper side.

As the substrate 11, use may be made of an insulating substrate of such as aluminum nitride (AlN) ceramics high in thermal conductivity, an insulating substrate such as silicon carbide (SiC) and a substrate of semiconductor single crystal of such as silicon or diamond IIa. The substrate 11 preferably has a surface roughness of not more than 0.05 μm to reduce voids in the solder layer 14 to be prepared on the substrate 11. In order to increase adherence between the substrate 11 and the electrode layer 13, the adherent layer 12 is formed on an upper surface of the substrate 11. The adherent layer 12 is preferably of a metal which is different from that of the electrode layer 13 and can be anyone of titanium (Ti), platinum (Pt), nickel (Ni), tungsten (W), molybdenum (Mo), silver (Ag), copper (Cu), iron (Fe), aluminum (Al) and gold (Au) used.

Here, a diffusion preventing layer (not shown) may be laid on the adherent layer 12. Said diffusion preventing layer may be made of platinum, palladium (Pd), or others.

As the metal of the electrode layer 13, use can be made of any one of, e.g., gold (Au), platinum (Pt), silver (Ag), copper (Cu), iron (Fe), aluminum (Al), titanium and tungsten (W). Two or more of these metals can be included. The electrode layer 13 may be formed in the form of a circuit pattern as desired and may in part be formed with an electrical circuit or circuits having gold or aluminum wires connected thereto for connection to external terminals.

Further, a solder barrier layer (not shown) may be laid between the electrode layer 13 and the solder layer 14. The solder barrier layer that may be used to prevent such as gold constituting the electrode layer 13 from diffusing into the solder layer 14 and to avoid a rise in the melting point of the solder layer 14 is also called the solder diffusion preventing layer. Then, the solder barrier layer may be of platinum or palladium (Pd) used.

The solder layer 14 of the electronic device bonding substrate 10, in which after it is molten and solidified voids are small in number and size, is reduced in specific resistance. Especially, if the voids of a solder layer 14 molten and solidified are made to have a maximum diameter of not more than 0.5 μm, the solder layer 14 molten and solidified can have a specific resistance of not more than 0.4 Ω·μm. In addition, the solder layer if its void density is made not more than 1 void/μm$^2$, can have a specific resistance of not more than 0.2 Ω·μm. The solder layer 14 in which specific resistance is small can suppress generation of Joule heat and power consumption.

The solder layer 14, as voids produced therein after it is molten and solidified are small in diameter, its molten and solidified surfaces are held to remain flat. Therefore, the light reflectivity of the solder layer 14 surfaces can be increased. As a result, a light emitting device mounted on the electronic device bonding substrate 10 can have its emission output increased since light emerging from it on its solder layer 14 side is reflected at an increased probability.

The solder layer 14 as voids therein are small in diameter and low in density is low in thermal resistance. Further, by reducing the density of carbon at an interface between the electrode layer 13 and the solder layer 14 and at an interface between the substrate 11 and the electrode layer 14 to not more than $1\times10^{20}$ cm$^{-3}$, it is possible to reduce the thermal resistance at the interfaces between the electrode layer 13 and the solder layer 14 and between the substrate 11 and the electrode layer 13.

According to the electronic device bonding substrate 10 as mentioned above, it is possible to reduce its thermal resistance to not more than 0.5 K/W and to efficiently transfer and release the heat generated to the substrate 11 when an electronic device such as a light emitting device is driven.

Mention is next made of an example in which a semiconductor device is mounted on the electronic device bonding substrate shown in FIG. 1. As the electronic device bonding substrate, the application to an electronic device bonding submount, which uses submount substrate for a relatively small device in area such as light emitting device or semiconductor laser diode, will be explained.

Figure 2:
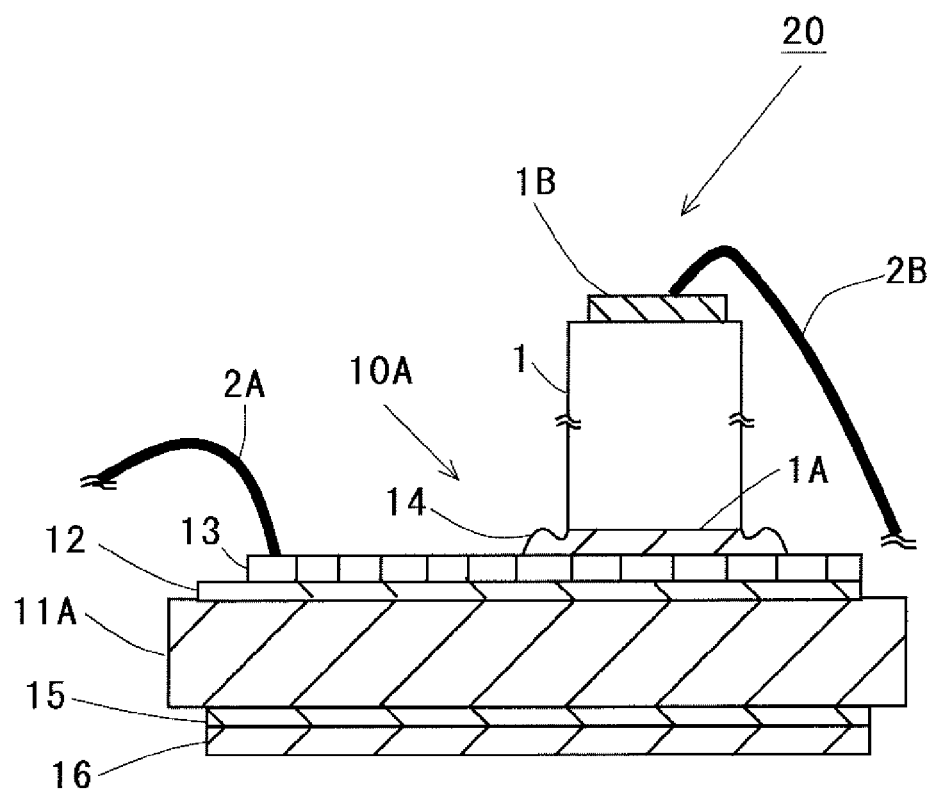
FIG. 2 is a cross-sectional view diagrammatically illustrating a structure in which a semiconductor device is mounted on the electronic device bonding submount shown in FIG. 1.

FIG. 2 is a cross-sectional view illustrating an electronic component 20 of the structure in which a semiconductor device 1 is mounted on the electronic device bonding submount 10A shown in FIG. 1. In the electronic component 20 as shown in FIG. 2, the semiconductor device 1 is mounted on the submount substrate 11A with a lower electrode 1A of the semiconductor device 1 bonded by solder to the solder layer 14. Also, an upper electrode 1B of the semiconductor device 1 has an external terminal (not shown) and a gold wire 2B wire-bonded thereto. On the other hand, as shown the upper surface of the electrode layer 13 where it is not covered with the solder layer 14 has an external terminal (not shown) and a gold wire 2A wire-bonded thereto so that an electric circuit with the semiconductor device 1, the solder layer 14, the electrode layer 13 and the gold wires 2A and 2B is formed.

Here, the submount substrate 11A is made of the same material as the substrate 11. It should be noted here that the semiconductor device 1 can be a light emitting device such as a laser diode or a light emitting diodes an active device such as a diode, or an active device such as transistor or thyristor for use in high-frequency amplification or switching, or an integrated circuit. Other than a semiconductor device, the electronic device can be a passive component, a switch or the like.

Here, the solder layer 14 to be used to bond the semiconductor device 1 to the electronic device bonding submount 10A is once molten by heating by lamp heating or else at a temperature higher than its melting point and then solidified by cooling. As shown in FIG. 2, in the state that the electronic device bonding submount 10A has the semiconductor device 1 mounted thereon, the solder layer 14 made up of lead free solder has a specific resistance as reduced as not more than 0.4 Ω·μm as mentioned previously. Thus, in the electric circuit mentioned above it is possible to suppress generation of Joule heat by the solder layer 14, to restrain a rise in the forward voltage in the semiconductor device 1 and to operate the latter efficiently.

Mention is next made of a method of making an electronic device bonding submount 10A of the present invention.

A submount substrate 11A is prepared and its both sides are ground with a lapping machine. Then, its finish polishing is carried out using a polishing machine. In this process, the submount substrate 11A is polished preferably to have a surface roughness of not more than 0.05 μm. If this roughness limit of the submount substrate 11A is exceeded, the electrode layer 13 and the solder layer 14 formed on the submount substrate 11A will have a surface roughness becoming larger, thus disadvantageously since voids will then be grown in number in the solder layer while it is being formed. Subsequently, the submount substrate 11A polished is washed.

Next, the adherent layer 12 and the electrode layer 13 are patterned by photolithography. Specifically, after a resist is coated uniformly over an entire upper surface of the submount substrate 11A with a spinner, it is baked as desired in a baking furnace and then is subjected to contact exposure using a mask aligner. After the exposure, a portion of the resist where the electrode layer is to be formed is dissolved using a developer of tetramethylamine family. Then, a surface of the submount substrate 11A where the electrode layer 13 is to be formed is cleaned using ultraviolet ozone treatment or oxygen plasma ashing to remove carbon compound deposited on a surface of a submount substrate 11A and to reduce the carbon concentration to not more than $1 \times 10^{20}$ cm$^{-3}$. This surface cleaning process contributes to removing impurities on surfaces of the submount substrate 11A and the electrode layer 13 and decreasing the thermal resistance of the electronic device bonding substrate 10A.

Subsequently, metals forming the adherent layer 12 and the electrode layer 13 are vapor-deposited with a vacuum deposition or sputtering apparatus, the entire resist is dissolved using acetone and metals on areas other than those becoming the adherent layer 12 and the electrode layer 13 are removed by lift-off to form the desired adherent and electrode layers 12 and 13 eventually.

Then, as in the process of forming the electrode layer 13, photolithography is used to form a resist on a surface of the submount substrate 11A on which the electrode layer 13 was formed and a surface of the electrode layer 13 on which the solder layer 14 is to be formed is exposed. Thereafter, a surface of the electrode layer 13 is preferably cleaned using ultraviolet ozone treatment or oxygen plasma ashing to remove carbon compound deposited on a surface of the electrode layer 13 and preferably to reduce the carbon concentration to not more than $1 \times 10^{20}$ cm$^{-3}$. This can suppress a rise in electrical resistance (contact resistance) generated between the solder layer 14 and the electrode 13 and a rise in thermal resistance of the electronic device bonding submount 10A.

Subsequently, the solder layer 14 is formed onto the electrode layer 13 whose surface is cleaned by using a vacuum deposition or sputtering apparatus. A solder film becoming the solder layer 14 is formed by deposition while controlling the rate of deposition, the substrate temperature during deposition and the degree of vacuum (background pressure) during deposition to suppress the generation of voids therein so that voids have a diameter not more than the desired size.

In forming the solder layer, the degree of vacuum is preferably less than $1 \times 10^{-3}$ Pa. If it is lower in vacuum than this, disadvantageously it becomes not possible for a uniform film to be formed during deposition and for a solder layer 14 fine in surface roughness to be obtained because atoms evaporating during vapor deposition tend to collide with residual gas molecules and not to go straight towards the submount substrate 11A.

The submount substrate 11A has a heating temperature, that is a substrate temperature, preferably of less than 100° C. By maintaining the heating temperature of the submount substrate 11A at 100° C. or lower, it is possible to suppress out-gassing of the resist, to limit deposition of a component of the resist on a surface of the electrode layer 13 forming the solder layer 14 thereon and to restrain gases emitted from the resist from mixing into the solder layer 14. If the heating temperature of the submount substrate 11A is higher than 100° C., it is not preferable that it takes time until evaporating atoms are cooled during which time diffusion of atoms or the like occurs and the surface of the solder layer 14 becomes rougher. Further undesirably, the resist applied for patterning tends, due to high temperature, to anchor onto surfaces of the submount substrate 11A and the electrode layer 13 to an extent that its lift-off may no longer be possible. By keeping the heating temperature of the submount substrate 11A at preferably 800° C. or lower, it may become possible to prevent the submount substrate 11A itself from warping and to form a uniform solder layer 14.

The rate of deposition for the solder layer 14 to be made is preferably 1 nm/second to 5 nm/second, more preferably not less than 1.5 nm/second but not more than 5 nm/second. With the rate of deposition of not less than 1 nm/second for the solder layer 14, it is possible to reduce the deposition time and to limit a rise in temperature of the submount substrate 11A by a source of evaporation. As a result, it is possible to effectively control voids in the solder layer 14 deposited, thus to form a dense solder layer 14 and to make finer the surface roughness of the solder layer 14 molten and densified. Especially, with the rate of deposition of not less than 1.5 nm/second for the solder layer 14, it advantageously becomes easy to achieve a controlled rise in temperature of the submount substrate 11A. With the deposition rate made excessive as rapid as 5 nm/second or more, there comes to be insufficient time for atoms deposited to be cooled, thus disadvantageously causing an undesirable rise in temperature of the submount substrate 11A such that the surface roughness of a solder layer 14 may become deteriorated and voids may become apt to be produced.

Finally, the submount substrate 11A obtained is cut into a desired size of the submount 10 with a dicing machine.

A semiconductor device 1 is mounted on the electronic device bonding submount 10A made as mentioned above by bonding the semiconductor device 1 thereto via the solder layer 14 molten by lamp heating and then carrying out necessary wire-bonding.

According to the method of manufacture mentioned above, it is possible to form an electronic device bonding submount 10A having a solder layer 14 whose specific resistance and thermal resistance are low, by cleaning a metal interface surface between the electrode and solder layers 13 and 14 and forming on the cleaned surface the solder layer 14 in which even after it is molten and densified, voids contained are small in diameter.

EXAMPLE 1

Mention is next made in further details of the example concerning the electronic device bonding submount as an electronic device mounting substrate using a solder later of the present invention.

Surfaces on both sides of a sintered aluminum nitride substrate 11A having high thermal conductivity (230 W/mK) were ground with a lapping machine and then were finish-polished with a polishing machine. Then, the aluminum nitride substrate 11A had a surface roughness of 0.03 μm. In measuring the surface roughness, a surface-roughness measuring apparatus (made by Tencor Instrument, Inc.; model P-2) was used and a line measurement for a range of 1 mm was repeated three times to give measured values that were averaged.

Next, the polished aluminum nitride substrate 11A was washed. Subsequently, in order to pattern using photolithography, a resist was coated uniformly over an entire upper surface of the aluminum nitride substrate 11A with a spinner whereafter it was baked as desired in a baking furnace and then is subjected to contact exposure using a mask aligner. A mask for the exposure had a size of the aluminum nitride substrate 11A and was designed so that desired numbers can simultaneously be patterned. After the exposure, a portion of the resist where the electrode layer 13 is to be formed was dissolved using a developer of tetramethylamine family to expose the aluminum nitride substrate 11A.

Next, the exposed surface of the aluminum nitride substrate 11A was subjected to oxygen plasma ashing treatment (pressure of 1 Pa, high-frequency power of 300 W and treatment time of 2 minutes) to decrease carbon concentrations at its surface.

Subsequently, Ti, Pt and Au to form the adherent layer 12, the solder diffusion preventing layer and the electrode layer 13, respectively, were deposited by a vacuum deposition apparatus and the resist entirely was dissolved using acetone to remove by lift-off Ti, Pt and Au in areas other than those where the adherent layer 12 and the electrode layer 13 were formed. The adherent layer 12, the solder diffusion preventing layer and the electrode layer 13 in this electronic device bonding submount 10A had an area of vapor deposition of 2 mm×40 mm and thicknesses of 0.05 μm, 0.2 μm and 0.5 μm, respectively.

Likewise, the entire surface of the aluminum nitride substrate 11A where the electrode layer 13 was formed was masked with resist by photolithography and resist on the area where a solder layer 14 was to be formed was dissolved to expose the electrode layer 13. Next, the exposed surface of the aluminum nitride substrate 11A was subjected to oxygen plasma ashing treatment (pressure of 1 Pa, high-frequency power of 300 W and treatment time of 2 minutes) to decrease carbon concentration at the surface of the electrode layer 13. Then, a solder layer 14 having a thickness of 1 μm and an area of 2 mm×25 mm was formed using the vacuum deposition apparatus. The composition of the solder layer 14 was such that the atomic ratio of Au to Sn was 70:30. The film forming conditions for the solder layer included a degree of vacuum of $5 \times 10^{-4}$ Pa, a temperature of the aluminum nitride substrate of 60° C., a rate of deposition of 2 nm/second and a deposition time of 500 seconds.

Thereafter, the aluminum nitride substrate 11A was cut at desired portions with the dicing machine to obtain an electronic device bonding submount 10A.

Mention is next made of Comparative Example 1 to Example 1.

COMPARATIVE EXAMPLE 1

An electronic device bonding submount was made in the same manner as of Example 1 except that the surface cleaning of an aluminum nitride substrate 11 prior to forming an electrode layer 13 and the surface cleaning of the electrode layer 13 prior to forming a solder layer 14 were omitted.

Carbon concentration at the surfaces of the electrode layer 13 in the electronic device bonding submount 10A in each of Example 1 and Comparative Example 1 prior to forming of its solder layers 14, was measured using SIMS (Secondary Ion Mass Spectroscopy) and ESCA (Electron Spectroscopy for Chemical Analysis) methods. Carbon concentrations in the ESCA measurements were each computed on normalizing a carbon peak intensity with a gold peak intensity for the electrode layer 13.

Next, in each of Example and Comparative Example, surface roughness and electrical resistance values of the solder layer before and after its melting and solidification in the electronic device bonding submount 10A were measured. For these measurements, the solder layer 14 of the electronic device bonding submount 10A in each of Example and Comparative Example was molten by heating it at 300° C. in an nitrogen atmosphere by a lamp for a period of 10 seconds and then solidified by cooling at about 1° C./second with a nitrogen gas purge.

After the deposition of solder layer 14 of the present invention, its surface roughness values prior and after to its melting and solidification were measured using the surface roughness measuring apparatus (made by Tencor Instruments, Inc.; model P-2). Three times of line measurement for a range of 1 mm are repeated, and arithmetically averaging the measured value was obtained as the surface roughness (Ra).

Figure 3:
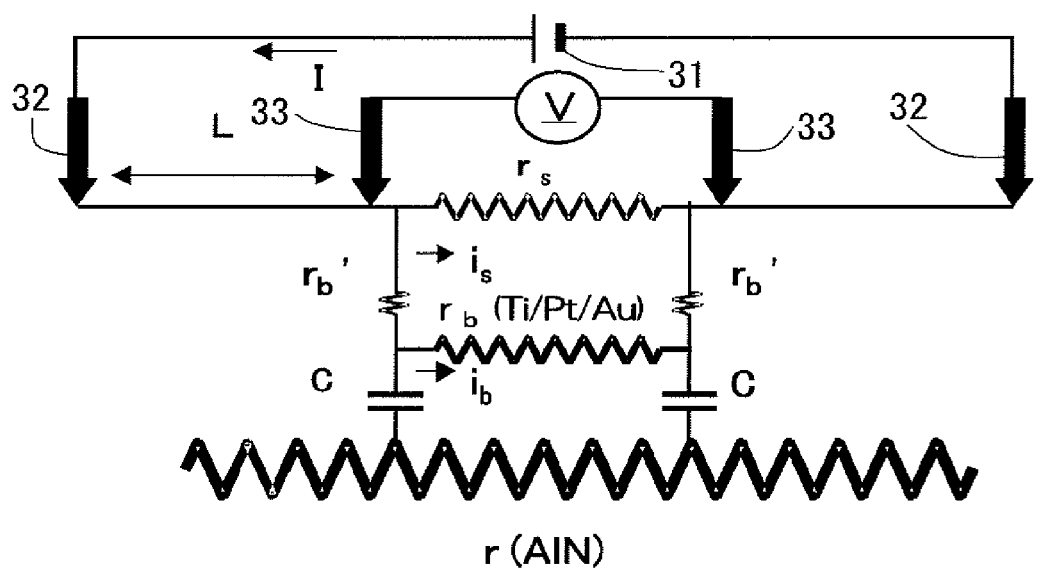
FIG. 3 is a diagrammatic view illustrating an electronic device bonding submount in an equivalent circuit thereof used in a specific example of the invention and a method of measuring a specific resistance of a solder layer by a four-terminal process.

FIG. 3 is a diagrammatic view illustrating a method of measuring of a solder layer 14 of an electronic device bonding submount 10A by a four-terminal process a specific resistance. FIG. 3 shows an equivalent circuit of the electronic device bonding submount in the measurement of a specific resistance of the solder layer 14 as an ideal model in which no contact resistance is created between the solder layer 14 and a metal layers consisting of an adherent layer 12, a diffusion preventing layer, and an electrode layer 13. In FIG. 3, characters rs, rb and r are used to indicate resistance of the solder layer 14, resistance of a metal layer (Ti/Pt/Au) as a sum of resistances of the metal adherent layer 12, diffusion preventing layer and electrode layer 13 connected parallel and resistance of the aluminum nitride substrate 11A (AlN), respectively, and character C is used to indicate junction capacitance as potential difference between the aluminum nitride substrate 11A as an insulator and the adherent layer 12. In the measurement of a specific resistance by the four-terminal process as shown in FIG. 3, the solder layer has contacted therewith a pair of current terminals 32 through which current I is passed from a DC source 31 to the solder layer. A further pair of voltage measuring terminals 33 are connected at positions between the current terminals 32 such that a distance between the current and voltage terminals 32 and 33 and a distance between the voltage terminals 33 are each constant as L and that the current and voltage terminals 31 and 32 lie in a straight line, and a voltage induced across the electronic device bonding submount 10A when the current is passed is measured with a voltmeter 34. And, resistance R of the electronic device bonding submount 10A is measured from a current value passed between the current terminals 32 and a voltage induced between the voltage measuring terminals 33. Resistance R of the electronic device bonding substrate then obtained is a combined resistance of resistance rs of the solder layer 14 and resistance rb of the metal layer as expressed by equation (1) below.

$$R = (rs \times rb)/(rs + rb) \tag{1}$$

Next, a resistance of the electronic device bonding submount 10A in which the solder layer 14 has not been formed, namely resistance rb of the metal layer is measured. In the measurement as in the manner with the electronic device bonding submount 10A, the current terminal 32 is contacted with the electrode layer surface made by the same condition and current I is passed from the DC source 31 through the current terminals 32 to the electrode layer (metal layer). The voltage measuring terminals 33 are disposed at positions between the current terminals 32 such that a distance between the current and voltage terminals 32 and 33 and a distance between the voltage terminals 33 are each constant as L' and that the current and voltage terminals 31 and 32 lie in a straight line, and a voltage induced across the metal layer when the current is passed is measured with a voltmeter 34. And, resistance rb' of the metal layer is measured from a current value passed between the current terminals 32 and a voltage induced between the voltage measuring terminals 33. Then, assuming that an area of the cross section of the metal layer that is perpendicular to a direction of current passage between the electrode terminals 33 is $S_2'$, specific resistance $\rho b$ of the metal layer is calculated from resistance $rb'$ of the metal layer by equation (2) below.

$$\rho b = (S2'/L') \times rb' \tag{2}$$

It is assumed that specific resistance $\rho b$ of the metal layer of an electronic device mounting submount 10A without a solder layer 14 formed thereon obtained by equation (2) is identical to that of the metal layer of the electronic device bonding submount 10A having the solder layer 14 formed. In this case, resistance rb of the metal layer in the electronic device bonding submount 10A having the solder layer 14 formed can be calculated as shown in equation (3) below with the assumption that an area of the cross section that is perpendicular to a direction of current passage between the electrode terminals 33 of the electronic device bonding submount 10A is $S_1'$.

$$rb = \rho b \cdot (L/S1') \tag{3}$$

The Value R' as a subtraction of resistance of the electronic device bonding substrate without the solder layer 14 from the above mentioned resistance R of electronic device bonding substrate was regarded as the resistance value of the solder layer 14. And, specific resistance of the solder layer 14 was calculated with equation (4) below with the assumption that an area of the cross section that is perpendicular to a direction of current passage between the voltage terminals 33 is S.

$$\rho = (S/L) \cdot R' \tag{4}$$

In this Example, the specific resistance mentioned above was measured as the passed current (I) of 20 mA by using the voltage-current generator R6240A made by Advantest Corporation.

Thermal resistance was measured by a thermal resistance measuring method according to Teknologue Co., Ltd. for the arbitrary number of electronic device bonding submount 10A prepared and picked up and having light emitting diodes 1 mounted thereon. In mounting a light emitting diode 1, the solder layer 14 of an electronic device bonding submount 10A prepared by the method of each of Example 1 and Comparative Example 1 was molten by heating it with a lamp at a melting temperature of 300° C. in an nitrogen atmosphere for a melting period of 10 seconds and the light emitting diode 1 was bonded by soldering therewith. As the light emitting diode 1, a red light emitting diode made of GaAlAs family was used. From above this light emitting diode chip 1, a load of 2.3 N was applied in a diameter area of 300 μm to the melt for soldering while the melt was solidified by cooling it at a rate of about 1° C./second with a nitrogen gas purge.

Mention is next made of the thermal resistance measurement of an electronic device bonding submount 10A having a light emitting diode 1 mounted thereon.

Figure 4:
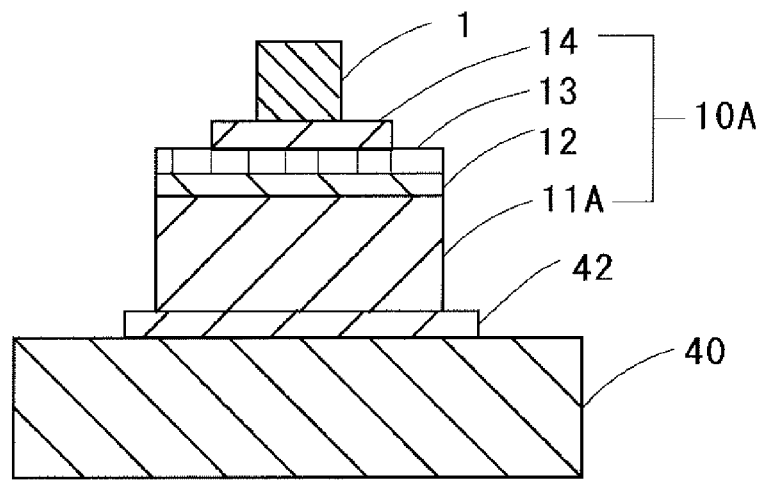
FIG. 4 is a cross-sectional view diagrammatically illustrating a state that an electronic device bonding submount having a light emitting diode mounted thereon is mounted on a stem.

FIG. 4 is a cross-sectional view diagrammatically illustrating a state that an electronic device bonding submount 10A having a light emitting diode 1 mounted thereon is mounted on a stem. As shown in FIG. 4, the electronic device bonding submount 10A having the light emitting diode 1 bonded by soldering thereto is mounted on the stem 40, as bonded thereto with low temperature solder or Ag paste 42 and is installed in a thermostatic bath held at a temperature $T_{ja1}$ as desired. In FIG. 4, wiring to the light emitting diode 1 is not shown. By passing through the light emitting diode 1 a constant current I, e, g., 1 mA, which is negligible of heat generation, a forward voltage $V_{fa1}$ then developed across the light emitting diode 1 is measured. Next, with the temperature of the thermostatic bath shifted to and maintained at $T_{ja2}$, a forward voltage $V_{fa2}$ of the light emitting diode 1 when the constant current I is passed. By repeating such a temperature shift of the thermostatic bath and the measurement it is possible to obtain a relationship between ambient temperature $T_j$ and forward voltage $V_f$ of the light emitting diode 1.

Figure 5:
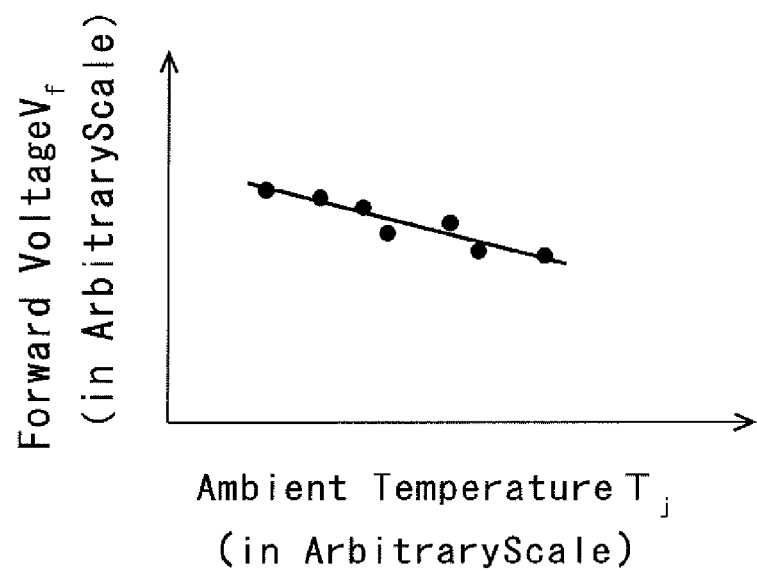
FIG. 5 is a graph illustrating a relationship between an ambient temperature $T_j$ and a forward voltage $V_f$ of a light emitting diode which is obtained from measurements.

FIG. 5 is a graph illustrating the relationship between ambient temperature $T_j$ and forward voltage $V_f$ of the light emitting diode 1 that is obtained from the measurements. In the graph, the ordinate axis represents forward voltage $V_f$ (in an arbitrary scale) of the light emitting diode 1 and the abscissa axis represents its ambient temperature $T_j$ (in an arbitrary scale).

From the graph shown in FIG. 5, the forward voltage of the light emitting diode 1 is expressed in a linear approximation by equation (5) below.

$$V_f = (\Delta V_f / \Delta T_j) \times T_j + V_{f0} \tag{5}$$

where $V_{f0}$ is a constant.

From the temperature characteristic of forward voltage $V_f$ of the light emitting diode 1 thus obtained, its temperature dependence $(\Delta V_f / \Delta T_j)$ is found.

Next, the thermostatic bath is restored to room temperature (25° C.) and the constant direct current is passed through the light emitting diode 1 to measure its forward voltage.

Figure 6:
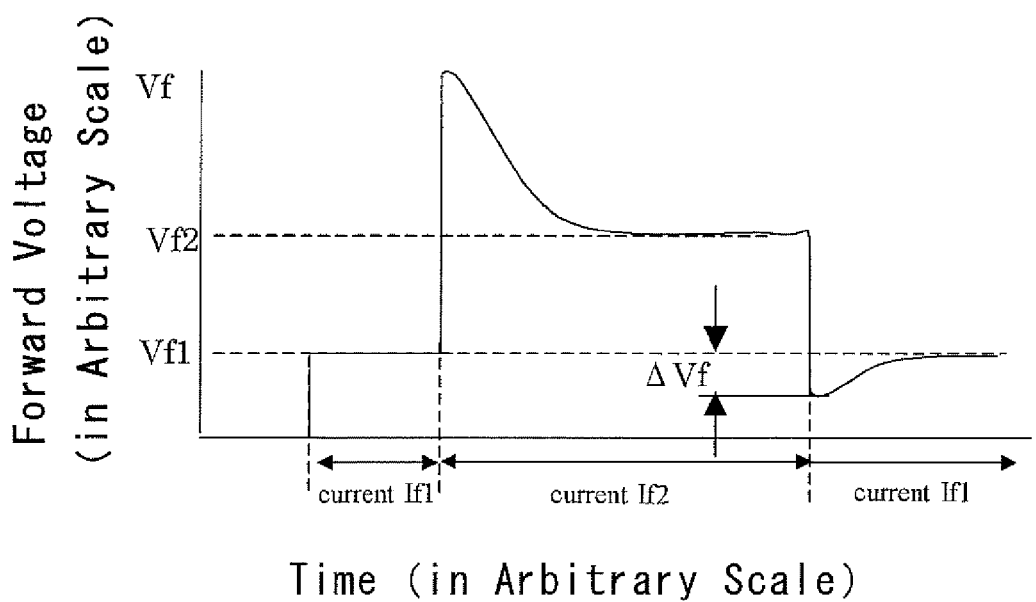
FIG. 6 is a graph illustrating a time chart when a light emitting diode is supplied with a constant direct current.

FIG. 6 is a graph illustrating a time chart when the light emitting diode 1 is supplied with the constant direct current. In the graph, the ordinate axis represents forward voltage $V_f$ (in an arbitrary scale) and the abscissa axis represents time (in an arbitrary scale). As shown in FIG. 6, the light emitting diode 1 is supplied with constant direct currents $I_{f1}$, $I_{f2}$ and $I_{f1}$ in succession and forward voltages then created are measured with an oscilloscope or the like. When the current is changed from $I_{f1}$ to $I_{f2}$ and then from $I_{f2}$ to $I_{f1}$, transient voltages develop. Accordingly, time periods for current $I_{f2}$ and for current $I_{f1}$ returned from $I_{f2}$ were continued as shown until stationary voltage values $V_{f2}$ and $V_{f1}$ are developed, respectively. Then, when the current is varied from value $I_{f2}$ to $I_{f1}$, the measured voltage first takes a value ($V_{f3}$) that is lower than forward voltage value $V_{f1}$ and then after a fixed lapse of time becomes stable to $V_{f1}$. The lowest value of forward voltage of the light emitting diode 1 and its difference from $V_{f1}$ are assumed to be $V_{f3}$ and $\Delta V_f$, respectively.

$\Delta T_j$ is derived from temperature dependence $(\Delta V_f / \Delta T_j)$ of $V_f$ of the device which has been previously found.

Here, the thermal resistance R of the light emitting diode 1 is found from a temperature rise per unit power as its definition by equation (6) as follows:

$$R = \Delta T_j / [(I_{f2} \cdot V_{f2}) - (I_{f1} \cdot V_{f1})] \tag{6}$$

Here, the measurement of the thermal resistance was made using the digital multi-meter (made by Advantest Corp.; model R 6240A) to give currents $I_{f1}$ of 1 mA and $I_{f2}$ of 50 mA.

Next, without using the electronic device bonding submount 10A, the thermal resistance was measured where the light emitting diode 1 was mounted directly on the stem 40.

Figure 7:
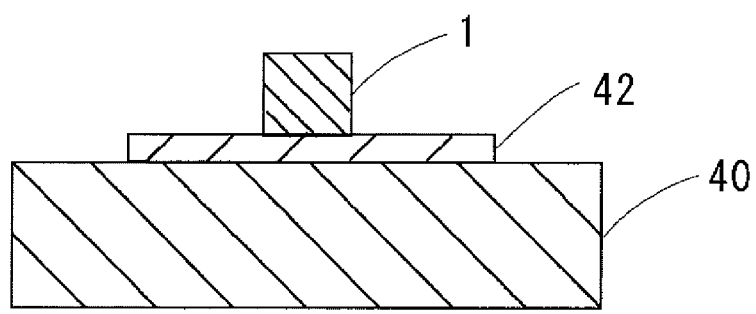
FIG. 7 is a cross-sectional view diagrammatically illustrating a manner in which a light emitting diode is mounted directly on a stem without using an electronic device bonding submount of the present invention.

FIG. 7 is a cross-sectional view diagrammatically illustrating a manner in which a light emitting diode 1 is mounted directly on a stem 40 without using an electronic device bonding submount 10A of the present invention.

As shown in FIG. 7, the light emitting diode 1 is mounted with a low-temperature solder, a conductive paste such as Ag paste or the like directly on the stem 40 having the electronic device bonding submount 10A mounted thereon of which the thermal resistance has been measured as mentioned above. The thermal resistance in this case was measured by the same method as mentioned previously. A difference between the thermal resistance measured when the light emitting diode 1 is mounted directly on the stem 40 and the thermal resistance measured when the light emitting diode 1 is mounted via the electronic device bonding submount 10A on the stem 40 becomes a thermal resistance of the electronic device bonding substrate 10A of the present invention which contains the solder layer 14.

Table 1 shows carbon concentrations at the surface of Au layer 13 measured by SIMS and ESCA measurements, surface roughness and specific resistance values of solder layer 14 before and after its meting and solidification and thermal resistance of solder layer 14 after its melting and solidification in an electronic device bonding submount in each of Example 1 and Comparative Example 1 mentioned above. It also shows forward voltage of light emitting diode 1 mounted on the electronic device bonding submount 10A, which is measured when it is supplied with a forward current of 150 mA.

It is apparent from Table 1 that carbon concentrations at the surface of Au electrode layer 13 as measured by SIMS were $9 \times 10^{19}$ atoms/cm$^3$ and $3 \times 10^{20}$ atoms/cm$^3$ in Example 1 and Comparative Example 1, respectively. As measured by ESCA, signal intensities of carbon at the surface of Au electrode layer 13 relative to Au signal intensity were 0.025 times and 0.085 times, respectively. Thus, it is seen from the SIMS and ESCA measurements that the carbon concentration at the surface of Au electrode layer 13 in Example 1 is reduced when its surface was cleaned.

On the other hand, the specific resistance of solder layer 14 in the electronic device bonding submount 10A made in Comparative Example 1 had values of 0.498 Ω·μm and 0.503 Ω·μm before and after its melting and solidification, respectively. From the above results, it is seen that in Example 1 in which a cleaning step is conducted and the surface of Au electrode layer 13 is reduced in carbon concentration before the solder layer 14 is formed, there is no change in specific resistance of the solder layer 14 between before and after its melting and solidification.

In Comparative Example 1, however, in which no cleaning step is conducted before the solder layer 14 is formed, it has been confirmed that the specific resistance of the solder layer 14 before and after its melting and solidification is about five times larger than that in Example 1 and it becomes larger as the carbon concentration at the surface of Au electrode layer 13 is increased.

Also, in Example 1 in which both surfaces of the submount substrate 11A and of the Au electrode layer 13 were cleaned and were reduced in carbon concentration, the thermal resistance of the electronic device bonding submount 110A had a value as low as 0.28 K/W. In Comparative Example 1, however, in which no cleaning step was conducted for either surface, it has been found that the thermal resistance had a value of 0.98 K/W which is about four times greater than that in Example 1 and the specific resistance of the solder layer 14 increase as the surface of Au electrode layer 13 is higher in carbon concentration.

TABLE 1

| | Solder Layer Composition (Au:Sn) | Au Layer Surface Carbon Concentration | | Solder Layer Surface Roughness (μm) | | Specific Resistance of Solder Layer (Ω · μm) | | Thermal Resistance (K/W) | Forward Voltage Vf(V) |
|---|---|---|---|---|---|---|---|---|---|
| | | SIMS (atom/cm$^3$) | ESCA (Normalized by Au Signal) | (before Melting and Solidification) | (after Melting and Solidification) | (before Melting and Solidification) | (after Melting and Solidification) | | |
| Example 1 | 70:30 | $9 \times 10^{19}$ | 0.025 | 0.037 | 0.039 | 0.077 | 0.103 | 0.28 | 2.67 |
| Comparative Example 1 | | $3 \times 10^{20}$ | 0.085 | 0.04 | 0.305 | 0.498 | 0.503 | 0.98 | 2.98 |

As shown in Table 1, the surface roughness of solder layer 14 in the electronic device bonding submount 10A made in Example 1 had values of 0.037 μm and 0.039 μm before and after its melting and solidification, respectively; showing no substantial change in surface roughness of solder layer 14 between before and after its melting and solidification.

On the other hand, the surface roughness of solder layer 14 in the electronic device bonding submount 10A made in Comparative Example 1 had values of 0.04 μm and 0.305 μm before and after its melting and solidification. While in Comparative Example 1 in which no cleaning step was conducted before the solder layer 14 is formed, the surface roughness of the solder layer 14 prior to its melting and solidification is substantially identical to that in Example 1, the surface roughness of the solder layer 14 after it is molten and solidified deteriorates markedly. From the above results, it has been found that in Example 1 in which the surface of Au electrode layer 13 is reduced in carbon concentration, there is no change developed in surface roughness between before and after the solder layer is molten and solidified.

The specific resistance of solder layer 14 in the electronic device bonding submount 10A made in Example 1 had values of 0.077 Ω·μm and 0.103 Ω·μm before and after its melting and solidification, respectively.

The forward voltages of the light emitting diodes 1 bonded by soldering to the electronic device bonding submounts 10A made in Example 1 and Comparative Example 1 were 2.67 V and 2.98 V, respectively. From these results, it has been found that the forward voltage of the light emitting diode 1 mounted on the electronic device bonding submount 10A in Example 1 in which the cleaning step was conducted before the solder layer 14 is formed and the surface of Au electrode layer 13 is reduced in carbon concentration is reduced to about 90% of that in Comparative Example 1.

EXAMPLE 2

From the results of Example 1, an electronic device bonding submount 10A was made in the same manner as in Example 1 except that the deposition time for a solder layer 14 was 1,500 seconds which is three times longer than that in Example 1 so as to deposit the solder layer to a thickness of 3 μm.

EXAMPLE 3

An electronic device bonding submount 10A was made in the same manner as in Example 1 except that the deposition time for a solder layer 14 was 3,250 seconds which is 6.5 times longer than that in Example 1 so as to deposit the solder layer to a thickness of 6.5 μm.

EXAMPLE 4

An electronic device bonding submount 10A was made in the same manner as in Example 2 except that the substrate temperature was 80° C. while the solder layer 14 was being formed.

EXAMPLE 5

An electronic device bonding submount 10A was made in the same manner as in Example 2 except that the solder layer 14 had a composition of Au and Sn whose ratio was 60:40.

EXAMPLE 6

An electronic device bonding submount 10A was made in the same manner as in Example 2 except that the solder layer 14 had a composition of Ag and Sn whose ratio was 95:5.

COMPARATIVE EXAMPLE 2

For the purposes of comparison with Example 2, an electronic device bonding submount of Comparative Example 2 was made under the same conditions for forming a solder layer 14 by deposition as in Example 2 except that the substrate temperature was 120° C.

Table 2 shows conditions collectively under which to make an electronic device bonding submount 10A in the Examples and Comparative Examples above, including the composition (in atomic ratio) of a solder layer, the degree of vacuum (Pa) in forming a solder layer, the temperature (° C.) of the aluminum nitride substrate 2, the deposition rate (in nm/second), the deposition time (in seconds) and the thickness (in μm) of a solder layer 14.

TABLE 2

|  | Solder Layer Composition (Atomic Ratio) | Vacuum in Forming Solder Layer (Pa) | AlN Substrate Heating Temperature (° C.) | Deposition Rate (nm/second) | Deposition Time (seconds) | Solder Layer Thickness (μm) |
|---|---|---|---|---|---|---|
| Example 1 | Au:Sn = 70:30 | 5 × 10$^{-4}$ | 60 | 2 | 500 | 1 |
| Example 2 |  |  |  |  | 1500 | 3 |
| Example 3 |  |  |  |  | 3250 | 6.5 |
| Example 4 |  |  | 80 |  | 1500 | 3 |
| Example 5 | Au:Sn = 60:40 |  | 60 |  | 1500 | 3 |
| Example 6 | Ag:Sn = 95:5 |  |  |  | 1500 | 3 |
| Comparative Example 1 | Au:Sn = 70:30 | 5 × 10$^{-4}$ | 60 | 2 | 500 | 1 |
| Comparative Example 2 |  |  | 120 | 2 | 1500 | 3 |

Table 3 shows thickness, surface roughness and resistivity of a solder layer 14 before its melting and solidification and those after the melting and solidification on an electronic device bonding submount 10A in each of the Examples and Comparative Examples as well as thermal resistance of the submount 10A, forward voltage of a light emitting diode 1 when mounted thereon and its emission output. Here, each forward voltage was measured for a forward current of 150 mA supplied to the light emitting diode 1 mounted on the electronic device bonding submount 10A by using a digital multi-meter (made by Advantest Corp.; model TR6143). The each emission output was measured by using an integrating sphere (made by Optoronics Co. Ltd.; 4 inch integrating sphere model 740-BC) and a power meter (made by Optoronics, Co, Ltd.; model 730A).

TABLE 3

|  | Solder Layer Thickness (μm) | | Substrate Temperature (° C.) | Solder Layer Surface Roughness (μm) | | Solder Layer Resistivity (Ω · μm) | | Thermal Resistance (K/W) | Forward Voltage (V) | Emission Output (mW) |
|---|---|---|---|---|---|---|---|---|---|---|
|  | (before Melting and Solidification) | (after Melting and Solidification) |  | (before Melting and Solidification) | (after Melting and Solidification) | (before Melting and Solidification) | (after Melting and Solidification) |  |  |  |
| Example 1 | 1 | 1.12 | 60 | 0.037 | 0.039 | 0.077 | 0.103 | 0.28 | 2.67 | 6.3 |
| Example 2 | 3 | 2.96 |  | 0.04 | 0.095 | 0.093 | 0.107 | 0.29 | 2.68 | 6.28 |
| Example 3 | 6.5 | 6.51 |  | 0.046 | 0.312 | 0.108 | 0.125 | 0.37 | 2.72 | 5.93 |

TABLE 3-continued

| | Solder Layer Thickness (μm) | | | Solder Layer Surface Roughness (μm) | | Solder Layer Resistivity (Ω·μm) | | | | |
|---|---|---|---|---|---|---|---|---|---|---|
| | (before Melting and Solidification) | (after Melting and Solidification) | Substrate Temperature (°C.) | (before Melting and Solidification) | (after Melting and Solidification) | (before Melting and Solidification) | (after Melting and Solidification) | Thermal Resistance (K/W) | Forward Voltage (V) | Emission Output (mW) |
| Example 4 | 3 | 2.95 | 80 | 0.039 | 0.295 | 0.099 | 0.258 | 0.44 | 2.77 | 5.68 |
| Example 5 | 3 | 2.95 | 60 | 0.035 | 0.093 | 0.086 | 0.099 | 0.24 | 2.65 | 5.41 |
| Example 6 | 3 | 2.96 | | 0.037 | 0.103 | 0.035 | 0.042 | 0.12 | 2.63 | 6.76 |
| Comparative Example 2 | 3 | 2.98 | 120 | 0.277 | 0.524 | 0.106 | 0.419 | 0.52 | 2.9 | 4.68 |

As shown in Table 3, the solder layer 14 on the electronic device bonding submount 10A made in Example 2 had values of thickness of 3 μm and 2.96 μm before and after its melting and solidification, respectively. The solder layer 14 before and after its melting and solidification had values of surface roughness of 0.04 μm and 0.095 μm, respectively. The solder layer 14 had values of specific resistance of 0.093 Ω·μm and 0.107 Ω·μm before and after its melting and solidification, respectively. The electronic device bonding submount 10A had a thermal resistance of 0.29 K/W and the light emitting diode 1 had a forward voltage of 2.68 V and an emission output of 6.28 mW.

The solder layer 14 on the electronic device bonding submount 10A made in Example 3 had values of thickness of 6.5 μm and 6.51 μm before and after its melting and solidification, respectively. The solder layer 14 before and after its melting and solidification had values of surface roughness of 0.046 μm and 0.312 μm, respectively. The solder layer had values of specific resistance of 0.108 Ω·μm and 0.125 Ω·μm before and after its melting and solidification, respectively. The electronic device bonding submount 10A had a thermal resistance of 0.37 K/W and the light emitting diode 1 had a forward voltage of 2.72 V and an emission output of 5.93 mW.

The solder layer 14 on the electronic device bonding submount 10A made in Example 4 had values of thickness of 34 μm and 2.95 μm before and after its melting and solidification, respectively. The solder layer 14 before and after its melting and solidification had values of surface roughness of 0.039 μm and 0.295 μm, respectively. The solder layer 14 had values of specific resistance of 0.099 Ω·μm and 0.258 Ω·μm before and after its melting and solidification, respectively. The electronic device bonding submount 10A had a thermal resistance of 0.44 K/W and the light emitting diode 1 had a forward voltage of 2.77 V and an emission output of 5.68 mW.

The solder layer 14 on the electronic device bonding submount 10A made in Example 5 had values of thickness of 3 μm and 2.95 μm before and after its melting and solidification, respectively. The solder layer 14 before and after its melting and solidification had values of surface roughness of 0.035 μm and 0.093 μm, respectively. The solder layer 14 had values of specific resistance of 0.086 Ω·μm and 0.099 Ω·μm before and after its melting and solidification, respectively. The electronic device bonding submount 10A had a thermal resistance of 0.24 K/W and the light emitting diode 1 had a forward voltage of 2.65 V and an emission output of 5.41 mW.

The solder layer 14 on the electronic device bonding submount 10A made in Example 6 had values of thickness of 3 μm and 2.96 μm before and after its melting and solidification, respectively. The solder layer 14 before and after its melting and solidification had values of surface roughness of 0.037 μm and 0.103 μm, respectively. The solder layer 14 had values of specific resistance of 0.035 Ω·μm and 0.042 Ω·μm before and after its melting and solidification, respectively. The electronic device bonding submount 10A had a thermal resistance of 0.12 K/W and the light emitting diode 1 had a forward voltage of 2.63 V and an emission output of 6.76 mW.

The solder layer 14 on the electronic device bonding submount 10A made in Comparative Example 2 had values of thickness of 3 μm and 2.98 μm before and after its melting and solidification, respectively. The solder layer 14 before and after its melting and solidification had values of surface roughness of 0.277 μm and 0.524 μm, respectively. The solder layer 14 had values of specific resistance of 0.106 Ω·μm and 0.419 Ω·μm before and after its melting and solidification, respectively. The electronic device bonding submount 10A had a thermal resistance of 0.52 K/W and the light emitting diode 1 had a forward voltage of 2.9 V and an emission output of 4.68 mW.

In the measurement results above, it has turned out from Examples 1 to 3 that with the substrate temperature of 60° C., the deposition rate of 2 nm/second and the thickness of the solder layer 14 of less than 6.5 μm, the solder layer 14 after its melting and solidification has a specific resistance of about 0.4 Ω·μm or less and the electronic device bonding submount 10A has a thermal resistance of 0.5 K/W or less.

From Examples 2, 5 and 6, it is seen that even if the solder layer 14 is varied in composition, its surface roughness and specific resistance remain each substantially unchanged before and after its melting and solidification. This indicates that with a substrate temperature for the solder layer 14 of 60° C. and a deposition rate of 2 nm/second, the solder layer 14 even after its melting and solidification has its specific resistance of not more than about 0.4 Ω·μm and the electronic device bonding submount 10A has its thermal resistance of not more than 0.5 K/W.

From Examples 2 and 4 compared with Comparative Example 2, it is seen that in Example 2 with a substrate temperature of 60° C. and Example 4 with a substrate temperature of 80° C., specific resistances of the solder after melting and solidification were as small as 0.4 Ω·μm or less. Especially in Example 2 with the substrate temperature of 60° C., the solder layer 14 has its surface roughness and specific resistance whose changes before and after its melting and solidification are small.

On the other hand, in Comparative Example 2 with a substrate temperature of 120° C. it is seen that the surface roughness and specific resistance of the solder layer 14 are each increased by approximately four times after the melting and solidification, and the thermal resistance of the electronic device bonding submount 10A becomes 0.5 K/W or more and consequently decreases the emission output of the light emitting diode 1.

This indicates that with a deposition temperature of 80° C. or lower and a deposition rate of 2 nm/second for the solder layer 14, the solder layer 14 even after its melting and solidification comes to have its specific resistance of about 0.4 Ω·μm or less and the electronic device bonding submount 10A comes to have its thermal resistance of 0.5 K/W or less.

Here, the Examples and Comparative Examples are compared as regards the specific resistance of a solder layer 14.

In examining the specific resistance of a solder layer 14 after its melting and solidification, Examples 1 to 6 are lower in specific resistance than Comparative Examples 1 and 2. This allows controlling the forward voltage of a light emitting diode to around 2.67 V. Generally, it has proven that in an electronic device bonding submount 10A a solder layer 14 after its melting and solidification should have a specific resistance of less than 0.4 Ω·μm. It has also turned out that the solder layer 14 should have a surface roughness of less than 0.05 μm before its melting and of less than 0.4 μm after its melting and solidification. Furthermore, it has become possible to reduce the surface roughness of a solder layer 14 to less than 0.4 μm and to improve its light reflectivity. As a result, it becomes possible for light produced at a light emitting diode mounted on an electronic device bonding submount 10A to be emitted efficiently from its front side.

Next, the electronic device bonding submount made in each of Example 2 and Comparative Example 2 was cut without melting and solidifying the solder layer 14. A cut surface of the solder layer 14 after its polishing was observed with a scanning electron microscope. The microscope had an accelerating voltage of 15 kV and a magnification of 5,000 and the observations revealed that there were little voids in the solder layer 14 prior to its melting and solidification in either Example 2 or Comparative Example 2.

Next, the electronic device bonding submount 10A having a light emitting diode 1 mounted thereon in each of Example 2 and Comparative Example 2 was cut and a cut surface of the solder layer 14 after it was likewise polished was observed with the scanning electron microscope. In bonding the light emitting diode 1, the solder layer 14 on the electronic device bonding submount 10 was molten by heating it with a lamp at a melting temperature of 300° C. in an nitrogen atmosphere for a melting period of 10 seconds and the semiconductor device 1 was bonded by soldering therewith. From above this light emitting diode chip, a load of 2.3 N was applied in a diameter area of 300 μm to the melt for soldering while the melt was solidified by cooling it at a rate of about 1° C./second with a nitrogen gas purge.

Figure 8:
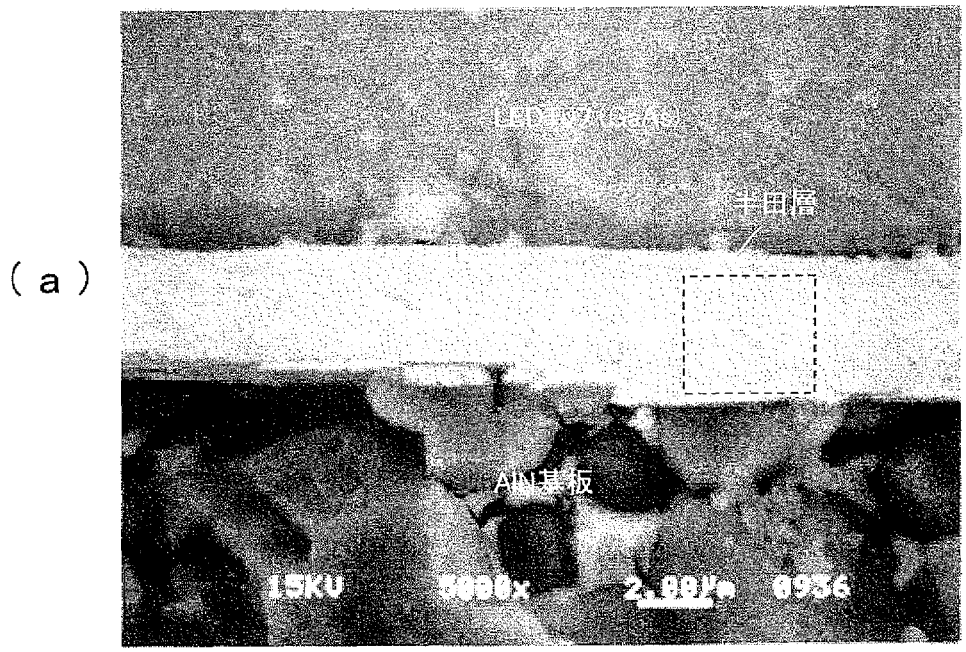
FIG. 8 caries (a) a scanning electron microscopic image taken and (b) a descriptive view thereof observed for a cut surface of an electronic device bonding submount of Example 2 having a light emitting diode mounted thereon.
Figure 8:
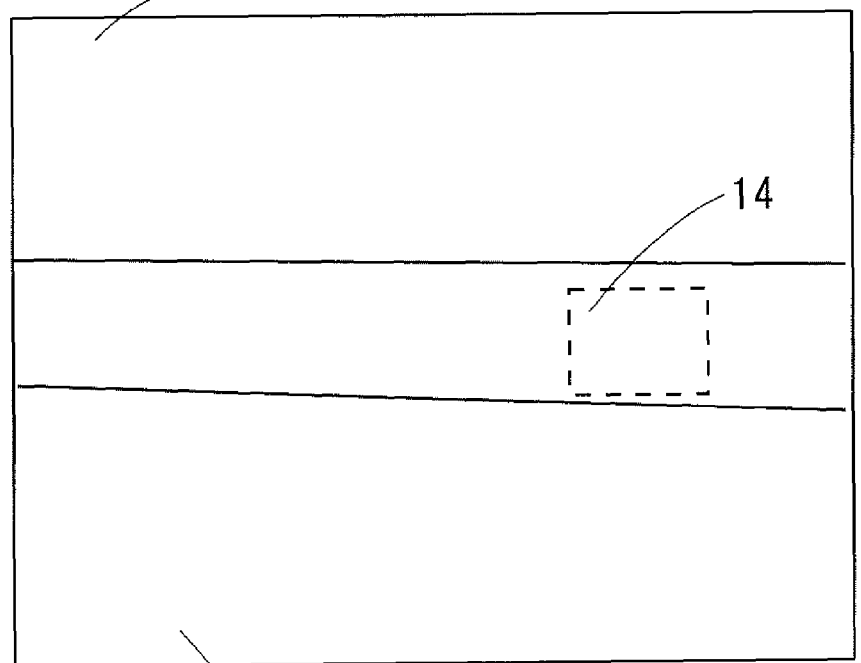

FIG. 8 caries (a) a scanning electron microscopic image taken and (b) a descriptive view thereof observed for a cut surface of an electronic device bonding submount having a light emitting diode mounted thereon according to Example 2. As is seen from FIG. 8, the bonding surface of the solder layer 14 to the light emitting diode 1 is flat and little voids are observed in the solder layer 14. The substrate for the light emitting diode is shown at 1a.

Figure 9:
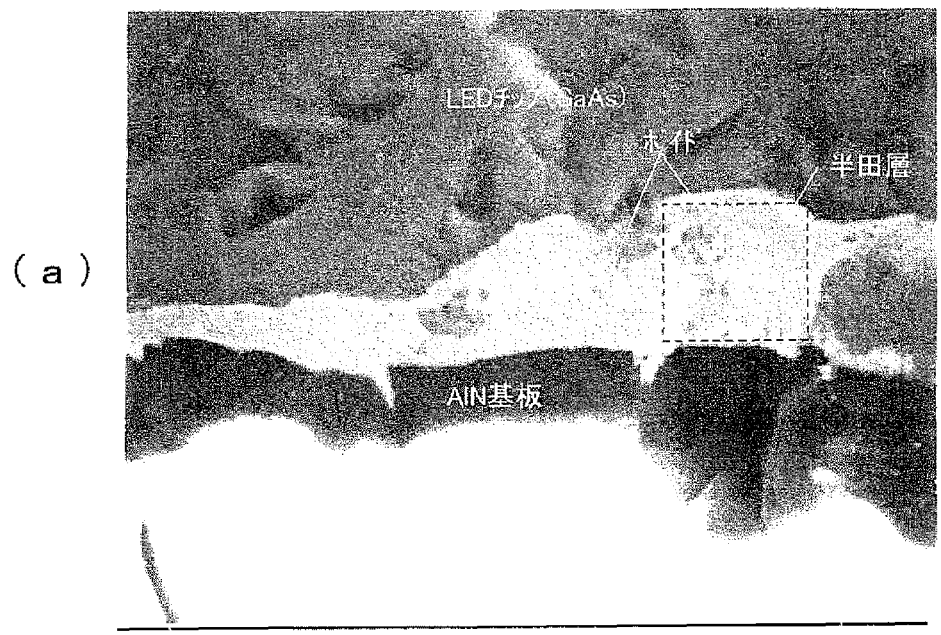
FIG. 9 caries (a) a scanning electron microscopic image taken and (b) a descriptive view thereof observed for a cut surface of an electronic device bonding submount of Comparative Example 2 having a light emitting diode mounted thereon.
Figure 9:
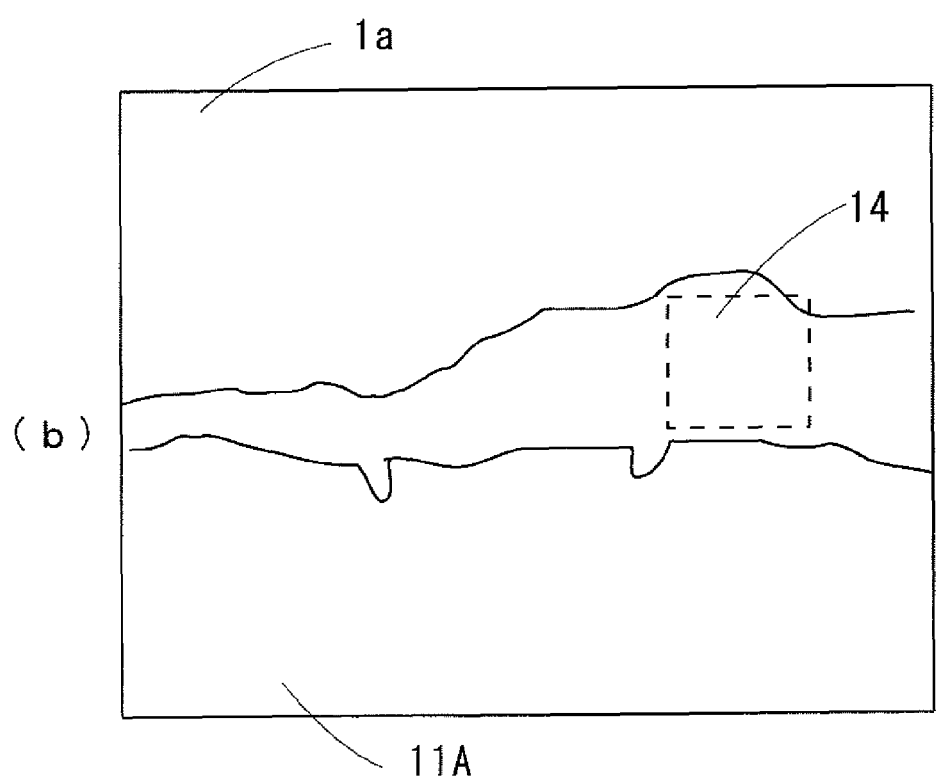

FIG. 9 carries (a) a scanning electron microscopic image taken and (b) a descriptive view thereof observed for a cut surface of an electronic device bonding submount having a light emitting diode mounted thereon according to Comparative Example 2. As is seen from the Figure, the bonding surface of the solder layer 14 to the light emitting diode is not flat and voids are observed.

Next, a portion of the solder layer in the scanning electron microscopic image in each of Example 1 and Comparative Example 2 above is subjected to image processing in which a void diameter is analyzed using a particle size analyzing program to approximate cross-sectional shapes of voids to circles. More specifically, first a given region of the scanning electron microscopic image is binarized using an image analyzing software (Scion Image) to compute the area of an individual void. Then, a circle having the computed area is found and its diameter is regarded as the diameter of a void. The analysis was made of a region of 12.91 μm$^2$ in Example 1 and a region of 16.83 μm$^2$ in Comparative Example 2 (each a region enclosed with broken lines in FIG. 8 and FIG. 9).

Table 4 shows results of analysis of diameters of voids in a solder layer in Example 1 and Comparative Example 2. The terms "area percentage", "total area of voids" and "void density" used in Table 3 indicate numerical values defined as follows: The area percentage is the proportion of a total area of voids to a total area for measurement. The total area of voids is an area of voids measured from image processing and not an area found from a void diameter turned into and calculated. The void density is a value given by dividing a measured number of voids by an area for measurement.

TABLE 4

|  | Example 1 | Comparative Example 2 |
|---|---|---|
| Number of Voids (number) | 6 | 31 |
| Maximum Void Diameter (μm) | 0.21 | 0.61 |
| Average Void Diameter (μm) | 0.11 | 0.16 |
| Total Area of Voids (μm$^2$) | 0.07 | 0.93 |
| Void Area Percentage (%) | 0.01 | 0.06 |
| Void Density (number/μm$^2$) | 0.46 | 1.84 |

In Example 1, the number of voids in the measurement area was 6, the void diameters were measured in the above method, including a maximum void diameter of 0.21 μm and an average diameter of 0.11 μm, and the total area of voids was 0.07 μm$^2$. Computed on the basis of these values, a void area percentage of 0.01% and a void density of 0.46 voids/μm$^2$ were yielded.

On the other hand, in Comparative Example 2 the number of voids in the measurement area was 31, the void diameters were measured in the above method, including a maximum void diameter of 0.61 μm and an average diameter of 0.16 μm, and the total area of voids was 0.93 μm$^2$. Computed on the basis of these values, a void area percentage of 0.06% and a void density of 1.84 voids/μm$^2$ were yielded.

Figure 10:
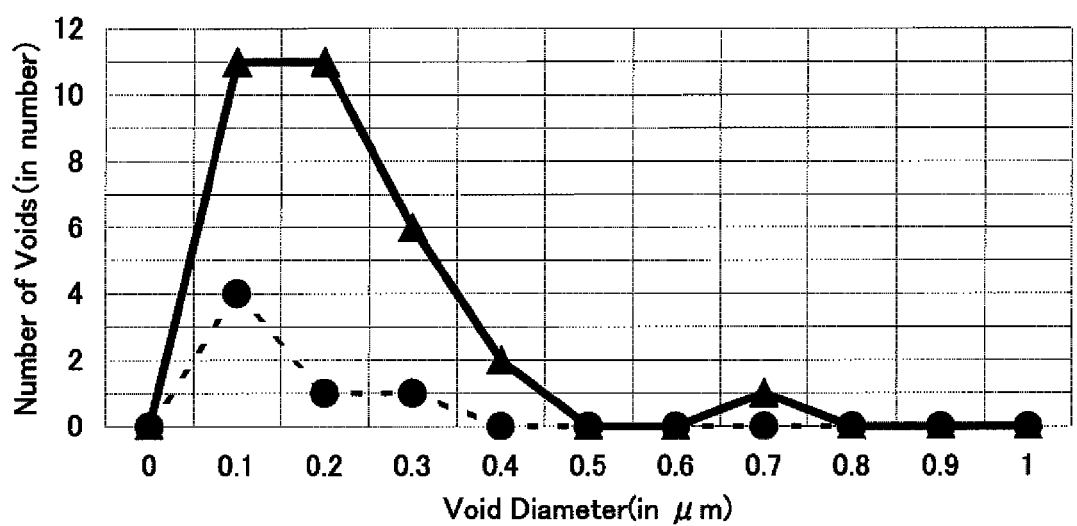
FIG. 10 is a graph illustrating diameter distributions of voids contained in solder layers of Example 1 and Comparative Examples 2, respectively.

FIG. 10 is a graph illustrating diameter distributions of voids contained in solder layers of Example 1 and Comparative Examples 2, respectively. The ordinate axis represents the number of voids (in number) and the abscissa axis represents the void diameter (in μm). Plots of black circle (●) indicate values in Example 1 while plots of black triangle (▲) indicate values in Comparative Example 2.

In Example 1, it is found that the void number has a peak at a void diameter in the neighborhood of 0.1 μm, which is smaller than in Comparative Example 2, and the maximum void diameter is around 0.5 μm. It is seen that the observed void number is smaller, too, in Example 1 than in Comparative Example 2.

From the above results, it is seen that Example 1 is smaller than Comparative Example 2 in maximum diameter, void area percentage and void density and hence smaller in specific resistance. It is thus seen that the maximum value computed from circular approximation of void diameters should be less than about 0.5 μm.

As can be seen from the specific examples mentioned above, by reducing the size of voids included in a lead free solder layer 14 in an electronic device bonding submount 10A and limiting the number of voids, it is possible to reduce its specific resistance and further to reduce its surface roughness as well. By reducing the specific resistance of a lead free solder layer after its melting and solidification in an electronic device bonding submount 10A to 0.4 Ω·μm and preferably to 0.2 Ω·μm, the electronic device bonding submount 10A can be made free from deterioration in property of a semiconductor device mounted thereon.

While in the specific examples mentioned above the solder layer 14 is shown formed of Au—Sn or Ag—Sn, it may contain two or more elements of silver, gold, copper, zinc, nickel, indium, gallium, bismuth, aluminum and tin.

The present invention is not limited to the electronic device bonding submounts described in the specific examples above but various modifications and applications thereof which are encompassed in the appended claims are possible including a solder layer as mounted on a substrate and an electronic device bonding substrate, which as a matter of course is included in the scope of the claimed invention.

What is claimed is:

1. An electronic device mounting substrate comprising:
a substrate;
an electrode layer formed on said substrate; and
a solder layer free from Pb formed on said electrode layer,
wherein said electrode layer consists essentially of Au,
wherein said solder layer consists essentially of AuSn, and has a specific resistance of not more than 0.4 Ω·μm, and
wherein voids contained in said solder layer have a maximum diameter of not more than 0.5 μm.

2. The electronic device mounting substrate as set forth in claim 1, wherein said electronic device mounting substrate has a thermal resistance of not more than 0.5 K/W.

3. The electronic device mounting substrate as set forth in claim 1, wherein said solder layer has a thickness of not more than 10 μm.

* * * * *